(12) United States Patent
Yosef et al.

(10) Patent No.: US 12,098,869 B2
(45) Date of Patent: Sep. 24, 2024

(54) COOLING SYSTEM WITH CONTROLLED BIPHASE MIXING OF REFRIGERANT

(71) Applicant: M.D. Mechanical Devices Ltd., Haifa (IL)

(72) Inventors: Lior Moshe Yosef, Nesher (IL); Eyal Simhon, Kiryat-Haim (IL)

(73) Assignee: M.D. Mechanical Devices Ltd., Haifa (IL)

( * ) Notice: Subject to any disclaimer, the term of this patent is extended or adjusted under 35 U.S.C. 154(b) by 0 days.

(21) Appl. No.: 17/406,138

(22) Filed: Aug. 19, 2021

(65) Prior Publication Data
US 2021/0381729 A1    Dec. 9, 2021

Related U.S. Application Data

(62) Division of application No. 16/662,055, filed on Oct. 24, 2019, now Pat. No. 11,112,147.

(51) Int. Cl.
*F25B 29/00*     (2006.01)
*F25B 41/20*     (2021.01)
(Continued)

(52) U.S. Cl.
CPC .............. *F25B 29/003* (2013.01); *F25B 41/20* (2021.01); *F25B 49/02* (2013.01); *H05K 7/20* (2013.01);
(Continued)

(58) Field of Classification Search
CPC ........ F25B 29/003; F25B 41/20; F25B 49/02; F25B 2300/00; F25B 2400/04; F25B 7/00; F25B 2400/0403; H05K 7/20
(Continued)

(56) References Cited

U.S. PATENT DOCUMENTS 2,986,899 A * 6/1961 Schenk ................. F25B 49/027
                                                    62/DIG. 17
4,457,138 A * 7/1984 Bowman ................ F25B 49/02
                                                      62/509
(Continued)

FOREIGN PATENT DOCUMENTS

CN       1732365       2/2006
CN     207230989       1/2018
(Continued)

OTHER PUBLICATIONS

Emerson Climate Technologies. (1970). Design Considerations for Refrigerant Receivers. Application Engineering. https://webapps.emerson.com/online-product-information/Publication/LaunchPDF?Index=AEB&PDF=ae1212.pdf (Year: 1970).*

(Continued)

*Primary Examiner* — Steve S Tanenbaum

(57) ABSTRACT

A method for cooling with a refrigerant based cooling system includes circulating a refrigerant in a main flow path of a refrigeration cycle including an accumulator, compressor, condenser and an evaporator, diverting a portion of flow to a bypass flow path from a location along the main flow path that is downstream the compressor and upstream the condenser and combining flow through the bypass flow path with flow through the main flow path downstream the condenser and upstream from the evaporator. The rate of flow through the bypass flow path may be dynamically controlled.

24 Claims, 12 Drawing Sheets

(51) Int. Cl.
*F25B 49/02* (2006.01)
*H05K 7/20* (2006.01)

(52) U.S. Cl.
CPC ....... *F25B 2300/00* (2013.01); *F25B 2400/04* (2013.01)

(58) Field of Classification Search
USPC ........................................................ 62/513
See application file for complete search history.

(56) References Cited

U.S. PATENT DOCUMENTS

| | | | | |
|---|---|---|---|---|
| 4,621,505 | A | * | 11/1986 | Ares ..................... F25B 47/022 62/509 |
| 5,168,715 | A | * | 12/1992 | Nakao ................... F25B 49/027 62/181 |
| 5,752,390 | A | * | 5/1998 | Hyde ...................... F25B 41/00 62/509 |
| 6,422,308 | B1 | | 7/2002 | Okawara et al. |
| 6,981,390 | B2 | | 1/2006 | Yamada et al. |
| 9,372,020 | B2 | | 6/2016 | Cowans et al. |
| 9,677,822 | B2 | | 6/2017 | Yosef et al. |
| 9,736,962 | B2 | | 8/2017 | Yosef et al. |
| 2010/0076611 | A1 | | 3/2010 | Cowans et al. |
| 2014/0326002 | A1 | * | 11/2014 | Sunderland ........... F25B 49/027 62/190 |
| 2016/0231040 | A1 | | 8/2016 | Hellmann |
| 2017/0144103 | A1 | * | 5/2017 | Kooyman ............... F25B 41/34 |
| 2021/0123642 | A1 | | 4/2021 | Yosef et al. |

FOREIGN PATENT DOCUMENTS

| | | | |
|---|---|---|---|
| EP | 2503264 | 9/2012 | |
| EP | 2910870 | 8/2015 | |
| EP | 2910870 A1 * | 8/2015 | .............. F25B 49/02 |
| WO | WO 2014/045400 | 3/2014 | |

OTHER PUBLICATIONS

Advisory Action Dated Mar. 30, 2021 From the Re. U.S. Appl. No. 16/662,055. (3 Pages).
European Search Report and the European Search Opinion Dated Jan. 26, 2021 From the European Patent Office Re. Application No. 20202991.4. (9 Pages).
Final Official Action Dated Jan. 21, 2021 from the Re. U.S. Appl. No. 16/662,055. (10 pages).
Interview Summary Dated Apr. 22, 2021 from the Re. U.S. Appl. No. 16/662,055. (3 pages).
Notice of Allowance Dated May 6, 2021 From the Re. U.S. Appl. No. 16/662,055. (9 Pages).
Official Action Dated Mar. 19, 2020 from the Re. U.S. Appl. No. 16/662,055. (8 pages).
Official Action Dated Sep. 24, 2020 from the Re. U.S. Appl. No. 16/662,055. (7 pages).
Restriction Official Action Dated Jan. 31, 2020 From the Re. U.S. Appl. No. 16/662,055. (8 pages).
English Summary Dated Jul. 6, 2023 of Notification of Office Action Dated Jun. 30, 2023 From the State Intellectual Property Office of the People's Republic of China Re. Application No. 202011129417.X. (2 pages).
Notification of Office Action and Search Report Dated Jun. 30, 2023 From the State Intellectual Property Office of the People's Republic of China Re. Application No. 202011129417.X (11 pages).

* cited by examiner

DETAIL B

DETAIL B

DETAIL C

COOLING SYSTEM WITH CONTROLLED BIPHASE MIXING OF REFRIGERANT

RELATED APPLICATION

This application is a division of U.S. patent application Ser. No. 16/662,055 filed on Oct. 24, 2019, the contents of which are incorporated herein by reference in their entirety.

FIELD AND BACKGROUND OF THE INVENTION

The present invention, in some embodiments thereof, relates to a bi-phase refrigerant based cooling system and, more particularly, but not exclusively, to a temperature forcing system for cooling semiconductor components under test.

Air conditioning units and refrigerators are example cooling systems commonly found in most households. The basic operation of such cooling systems includes circulating a refrigerant between a compressor, condenser, expansion valve and an evaporator. In some systems, the compressor is operated at a constant speed and temperature of the cooling system is regulated by turning the compressor OFF whenever a desired temperature is reached and then turning the compressor back ON with a threshold rise in temperature. The compressor may typically be the main power consuming component in the system. Other more advanced systems include inverter compressors that operate at variable speed. Operating the compressor at variable speed reduces the frequency at which compressor is required to be turned OFF/ON and also facilitates in operating the compressor at variable capacity. In this manner, power efficiency may be increased and noise level may be reduced. Furthermore, relatively fast cooling may be achieved by initially operating the inverter compressor at full capacity to reach a desired temperature and then significantly reducing the capacity to maintain that temperature. Drawbacks associated with inverter compressors includes increased cost of manufacture and mechanical complexity. Although, inverter compressors do provide some advantages, the need for cooling systems with improved cost efficiency, improved power efficiency and/or reduced noise is still a sought after goal.

A temperature forcing system is another example cooling system that is used to controllably cool semiconductor devices (chips or modules) under test. During the testing procedure, the temperature forcing system may subject a device under test (DUT) to range of temperatures over which the DUT may be configured to be operable or to extreme temperature values of its working range. Example extreme values may be between 125° C. and 165° C., at a high end of the working range, and between −40° C. and −70° C., at a low end of the working range. During operation, the DUT is also expected to generate heat. Precise temperature regulation is typically required to reach and maintain DUT in each of the desired temperatures even in the face of heat being generated by the DUT.

U.S. Pat. No. 9,677,822, entitled "Efficient temperature forcing of semiconductor devices under test," the contents of which is incorporated by reference herein discloses a temperature-forcing system and method, for controlling the temperature of an electronic device under test (DUT). The system is disclosed to include a refrigerant circulation subsystem that circulates bi-phase refrigerant, in closed loop fashion, through an evaporator so that, during circulation, said refrigerant is maintained at high pressure between a compressor and a metering device of the subsystem and at low pressure while flowing through the evaporator. The system additionally includes a plunger that is configured to physically contact a casing of the DUT and thereby form thermal contact between the DUT and the evaporator of the system.

SUMMARY OF THE INVENTION

According to an aspect of some embodiments of the present invention there is provided a refrigerant based cooling system with improved temperature regulation. According to some example embodiments, the cooling system is configured to regulate temperature based on dynamically controlling a ratio between gas and liquid refrigerant entering an evaporator of the cooling system. According to some example embodiments, the cooling system includes dedicated flow paths for each of the liquid and gas phase of the refrigerant and a mixing chamber in which the liquid and gas refrigerant may be mixed at the desired ratio. The gas refrigerant may be gas exiting the compressor at a high temperature. During operation, the evaporator may for example be fed with a relatively high ratio of gas to liquid when little or no active cooling is desired, and may be fed with a relatively low ratio of gas to liquid when high or maximum active cooling is desired. The present inventors have found that high accuracy temperature regulation as well as rapid changes in temperature may be achieved over relatively large working ranges based on the system and method described herein. Optionally, temperature may be regulated with an accuracy of up to 0.1° C.-1° C., e.g. 0.5° C.

The cooling system as described herein may also be cost efficient in that the improved temperature regulation may be achieved without additional moving parts or complex mechanical elements. In some example embodiments, the temperature regulation may be achieved while running the compressor at a steady speed and/or without turning the compressor ON/OFF during operation of the cooling system. When running the compressor at a steady speed, the cooling system may be operated with improved power efficiency and reduced noise.

In some example embodiments, the cooling system is configured for temperature forcing of electronic components under test and may provide fast changes in temperature with precise temperature regulation over a large working range. In other example embodiments, the cooling system may be adapted to control the temperature of other solid bodies or fluids and may be integrated in other systems including air conditioning (AC) systems and refrigerators.

According to an aspect of some example embodiments, there is provided a method for cooling with a refrigerant based cooling system, the method comprising: circulating a refrigerant in a main flow path of a refrigeration cycle including an accumulator, compressor, condenser and an evaporator; diverting a portion of flow to a bypass flow path from a location along the main flow path that is downstream the compressor and upstream the condenser; dynamically controlling rate of flow through the bypass flow path; and combining flow through the bypass flow path with flow through the main flow path downstream the condenser and upstream from the evaporator.

Optionally, the flow through the bypass flow path and the flow through the main flow path is combined in a dedicated mixing chamber, wherein the mixing chamber is integrated in the main flow path downstream from the condenser and upstream from the evaporator.

Optionally, the portion of flow that is diverted to the bypass flow path is flow of the refrigerant in a gaseous phase.

Optionally, the refrigerant upstream from the bypass flow path is bi-phasic refrigerant and wherein the method further comprises: separating a liquid refrigerant from a vaporized refrigerant; directing the liquid refrigerant to the condenser via the main flow path; and diverting at least a portion of the vaporized refrigerant to the bypass flow path.

Optionally, the refrigerant upstream from the bypass flow path is fully vaporized.

Optionally, the method includes sensing a cooling effect of the cooling system and adjusting the rate of refrigerant flow through the bypass flow path based on the cooling effect that is sensed.

Optionally, the method includes cooling refrigerant flowing through the condenser based on heat exchange with a second refrigeration cycle that is thermally coupled with the condenser.

Optionally, the main flow path is configured to branch out into a plurality of sub-flow paths downstream from the condenser, and wherein refrigerant flowing in each of the plurality sub-flow paths feeds into one of a plurality of evaporators and wherein the refrigerant flowing in the plurality of evaporators is collected by the accumulator.

Optionally, the bypass flow path is configured to branch out into a plurality of sub-bypass flow paths, wherein flow rate of refrigerant though each of the plurality of sub-bypass flow paths is separately controlled.

Optionally, vaporized refrigerant from each of the plurality of sub-bypass flow paths is combined with liquid refrigerant in one of the plurality of sub-flow paths of the main flow path.

According to an aspect of some example embodiments, there is provided a cooling system comprising: a refrigerant; an accumulator, a compressor, a condenser and an evaporator fluidly connected by a main flow path configured to circulate refrigerant therein; a bypass flow path configured to divert a portion of flow from a location on the main flow path that is downstream the compressor and upstream the condenser; a valve configured to control flow through the bypass flow path; a mixing chamber configured to receive refrigerant from both the main flow path and the bypass flow path and to direct outflow from the mixing chamber to the evaporator; and a controller configured to dynamically control operation of the valve.

Optionally, the mixing chamber comprises: a first inlet configured to receive flow from a location along the main flow path that is downstream the condenser and upstream from the evaporator; a second inlet configured to receive flow from the bypass flow path; and an outlet configured to direct flow from one or more of the first inlet and the second inlet to the evaporator.

Optionally, outflow from the mixing chamber is through a tube including an open tip penetrating within the mixing chamber, wherein the tip is positioned at a defined height within the mixing chamber.

Optionally, the tube is integral to a metering device providing flow communication between the mixing chamber and the evaporator.

Optionally, the tube is a capillary tube.

Optionally, the mixing chamber is elongated in a vertical direction and wherein the first inlet is positioned below the second inlet.

Optionally, the portion of flow through the bypass flow path is gaseous flow.

Optionally, the cooling system includes a vapor-liquid separator integrated into the main flow path downstream from the compressor and configured to direct flow to the bypass flow path.

Optionally, the vapor-liquid separator is configured to receive bi-phase refrigerant from the compressor and to separately direct liquid refrigerant to the condenser and at least a portion of the vaporized refrigerant to the bypass flow path.

Optionally, the cooling system includes a flow splitter configured to divide outflow from the compressor between the main flow path and the bypass flow path.

Optionally, the refrigerant upstream the flow splitter is fully vaporized.

Optionally, the cooling system includes a sensor configured to sense a cooling effect of the cooling system, wherein the controller is configured to receive input from the sensor and to regulate the valve based on the input.

Optionally, the cooling system includes an additional refrigeration cycle separate from the main flow path and thermally coupled to the condenser, wherein the additional refrigeration cycle is configured cool refrigerant in the main flow path.

Optionally, the cooling system includes a plurality of evaporators and wherein refrigerant from the plurality of evaporators is collected by the accumulator.

Optionally, the cooling system includes a plurality of sub-bypass flow paths, each branching out from the bypass flow path; a plurality of valves, each of the plurality of valves configured to control flow through one of the plurality of sub-bypass flow paths; and a plurality of mixing chambers, each of the plurality of mixing chambers configured to receive refrigerant from both the main flow path and one of the plurality of sub-bypass flow path and to direct outflow from the mixing chamber to one of the plurality of evaporators.

Optionally, the controller is configured to separately control each of the plurality of valves.

Optionally, the cooling system includes a plurality of sensors, each configured to sense a cooling effect based on one of the plurality of evaporators, wherein the controller is configured to regulate the plurality of valves based on input from the plurality of sensors.

According to an aspect of some example embodiments, there is provided a mixing chamber integrated in a refrigeration cycle, the mixing chamber comprising: a housing having an elongated shape along a vertical direction; a first inlet configured to receive condensed liquid refrigerant from a main flow path of a refrigeration cycle; a second inlet configured to receive vaporized refrigerant expelled from a compressor of the refrigeration cycle; and an outlet port configured to direct flow from one or more of the first inlet and the second inlet to an evaporator of the refrigeration cycle.

Optionally, the mixing chamber includes a tube extending through the outlet and configured to extend vertically within the housing at a defined height, wherein flow out of the chamber is configured to flow through the tube.

Optionally, the tube extends out of the mixing chamber and is integral to a metering device of the refrigeration cycle.

Optionally, the tube is a capillary tube.

Optionally, an open end of the tube within the mixing chamber is angled.

Optionally, an open end of the tube within the mixing chamber is perforated.

Optionally, an open end of the tube within the mixing chamber is covered with a porous material.

Optionally, the first inlet is positioned below the second inlet.

Optionally, the outlet is through a floor or base of the housing.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
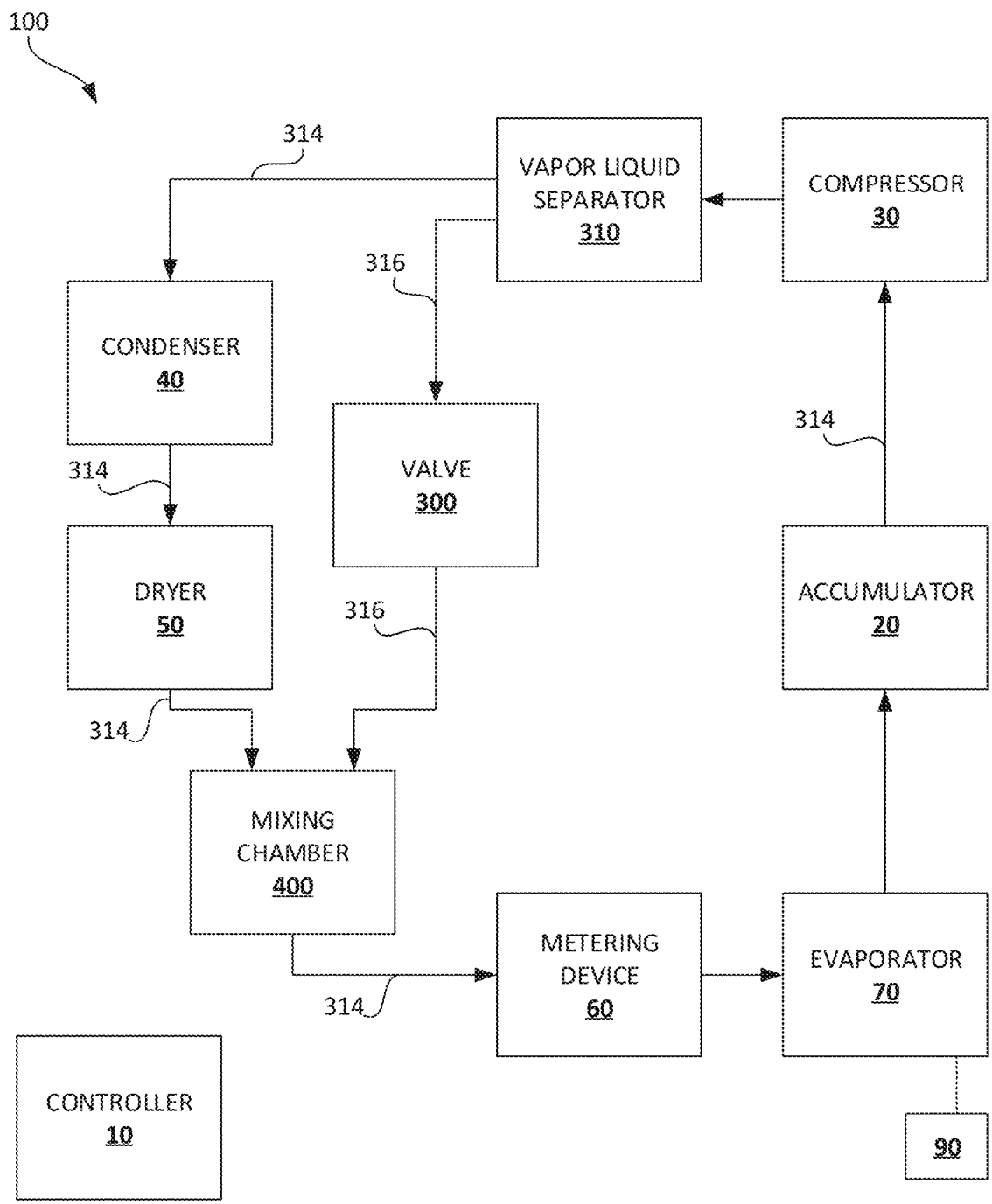
FIG. 1 is a simplified block diagram of an example single loop refrigeration cycle in accordance with some example embodiments.

The present invention, in some embodiments thereof, relates to a bi-phase refrigerant based cooling system and, more particularly, but not exclusively, to a temperature forcing system for cooling semiconductor components under test.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

According to some example embodiments, a refrigerant based cooling system includes, as part of a refrigeration cycle, separated flow paths for the refrigerant in each of a liquid and a gas phase and a mixing chamber configured to merge or mix the flow from the separated flow paths. According to some example embodiments, the refrigerant is supplied to both flow paths from a common compressor. Outflow from the mixing chamber may be fed into an evaporator through a metering device such as for example an expansion valve or, preferably, a capillary tube. According to some example embodiments, the gas and liquid refrigerant is configured to flow into the mixing chamber in a desired relative proportion that may be dynamically controlled. Optionally and preferably, the dynamic control is provided based on controlling a flow rate of the gas refrigerant into the mixing chamber. The desired relative proportion may be a desired volume ratio of gas to liquid. Optionally, flow rate of one or more of the gas and liquid into the mixing chamber may be controlled to obtain the desired relative proportion. In some example embodiments, the gas phase flow path includes a flow control valve and flow rate of gas is controlled with the flow control valve while the liquid passively flows into the mixing chamber based on the pressure level established with the flow control valve. The gas in the gas flow path is hot gas diverted from the main flow cycle. In some example embodiments, a controller of the cooling system is configured to control the flow control valve based on input from a user interface and/or output from one or more sensors, e.g. temperature sensors associated with the cooling system.

According to some example embodiments, temperature is regulated based on selectively altering a proportion of gas and liquid in the mixture supplied to the evaporator from the mixing chamber. By adjusting the gas flow control valve, the mixing chamber may be filled with gas and liquid in varying proportions. For example, a mixture that is predominately liquid may provide more cooling as compared to mixture that is predominately gas. Optionally, maximum cooling may be initiated based on closing the gas flow control valve and thereby allowing only liquid refrigerant to flow into the mixing chamber. Optionally, minimum cooling or no cooling may occur based on opening the flow control valve to a maximum working flow and thereby allowing only gas refrigerant to flow into the mixing chamber.

According to some example embodiments, the mixing chamber includes dedicated inlet ports for each of the liquid and gas flow paths and an outlet port from which the mixed flow is directed through a metering device to an evaporator. According to some example embodiments, a tube having an open end extends through the outlet port and is positioned with the open end at a defined height in the mixing chamber.

On an opposite end, the tube may be coupled to a metering device through which the liquid and gas in the mixing chamber flows into the evaporator. In some example embodiments, the mixing chamber is configured to have an elongated shape extending in a vertical direction. Optionally, the gas inlet port is positioned on an upper half of the mixing chamber and the liquid inlet port is positioned on a lower half of the mixing chamber. In some example embodiments, the outlet port at a base or floor of the mixing chamber is configured to receive a tube penetrating therethrough in a vertical direction. In this configuration, a height of the tube may optionally be adjusted, e.g. during a calibration procedure. Alternatively, the tube may penetrate through a side wall of the mixing chamber at a defined height. The open end or inlet of the tube may have different structural configurations. Optionally, the open end may be angled, may be perforated along a portion of its height and/or may be covered with an element that partially restricts flow into the open end.

In some example embodiments, the cooling system includes a vapor-liquid separator configured to divide outflow from a compressor into separated flow paths for liquid and gas. In some example embodiments, the vapor-liquid separator is a chamber including a liquid outlet at a bottom portion of the chamber and a vapor outlet at an upper portion of the chamber. The liquid and gas may be separated based on gravity. Optionally, an inlet to the vapor-liquid separator is also at an upper portion of the chamber.

In other example embodiments, output from the compressor is configured to be entirely in a gaseous phase, due for example to the type of refrigerant used, e.g. one with an essentially low boiling temperature, and therefore a vapor-gas separator may not be required. Instead, a filter or flow splitter may direct a first portion of the gas flow to the dedicated gas flow path and a second portion of the flow to the main branch, wherein a condenser (being part of a heat exchanger) may serve to liquefy the refrigerant. Optionally, the cooling system includes a dual cycle, with one of the cycles being dedicated to generating the liquid phase for the other cycle. Optionally, lower temperature may be reached with the dual cycle system as compared to a single cycle system.

According to some example embodiments, a cooling system may include multiple evaporators. Optionally, one or more of the evaporators may be individually controlled. For example, one or more of the evaporators may be associated with a dedicated mixing chamber, and flow control valve for controlling flow into the dedicated mixing chamber. Optionally, one or more of the evaporators is additionally associated with a dedicated temperature sensor based on which temperature may be regulated.

Reference is now made to FIG. 1 showing a simplified block diagram of an example single loop refrigeration cycle in accordance with some example embodiments. According to some example embodiments, a refrigeration cycle 100 may be similar to conventional refrigeration cycle in that refrigeration cycle 100 is configured to circulate a bi-phase refrigerant from an accumulator 20, through a compressor 30, a condenser 40, optionally and preferably a dryer 50, a metering device 60 and an evaporator 70, and then back to accumulator 20. Optionally and preferably accumulator 20 is a suction accumulator. Optionally and preferably metering device 60 is a capillary tube. Cooling of a body or a flow of air may be provided by evaporator 70 when thermally coupled by direct or indirect coupling to the body or a flow of air. A controller 10 controls operation of refrigeration cycle and may receive input from one or more sensors 90 and adjust cooling parameters based on input received from one or more sensors 90. Sensor 90 may be a temperature sensor, e.g. thermostat or thermocouple positioned on or near evaporator 70 or on the body that is to be cooled. Controller 10 may also include or be associated with a user interface configured to receive commands from a user operating the cooling system. Refrigeration cycle 100 together with controller 10 form an example cooling system. Sensors 90 when present may also be part of the cooling system.

According to some example embodiments, refrigeration cycle 100 is configured to direct, e.g. divert at least a portion of refrigerant gas flow downstream from compressor 30 through a dedicated bypass flow path 316 that bypasses condenser 40 and optionally and preferably dryer 50. Dedicated flow path 316 includes a valve 300 that is configured to control the flowrate therethough and thereby controllably reintroduce refrigerant gas in flow path 316 into a main flow path 314 of cooling system 100 downstream from a condenser 40 and dryer 50 when present and upstream from evaporator 70. Valve 300 may be controllably operated with controller 10. In some example embodiments, valve 300 is an off-the-shelf component that is configured to controllably regulate gas flow. According to some example embodiments, a mixing chamber 400 integrated in main flow path 314 is configured to receive both refrigerant gas flow from dedicated flow path 316 and refrigerant liquid flow from condenser 40 and/or dryer 50 and feed or direct the combined flow into metering device 60.

According to some example embodiments, refrigeration cycle 100 additionally includes a vapor-liquid separator 310 downstream from compressor 30 and upstream condenser 40. Vapor-liquid separator 310 is configured to divert from main flow path 314 refrigerant in purely gaseous phase into bypass flow path 316.

In operation, accumulator 20 draws in gas and/or a mixture of gas a liquid from evaporator 70. Optionally, the gas or mixture is suctioned out of evaporator 70. Suctioned flow is directed through compressor 30 configured to compress the gas and/or the mixture. According to some example embodiments, the compressed refrigerant (gas and/or mixture of gas and liquid) is then split in vapor-liquid separator 310 into a main flow path 314 toward compressor 40 and a bypass flow path 316. Bypass flow path 316 includes valve 300 and bypasses condenser 40 and optionally dryer 50 when present. In some example embodiments, controller 10 dynamically controls opening and closing of valve 300 and thereby a gas flowrate therethrough. According to some example embodiments, liquid from condenser 40 and gas from flow path 316 concurrently flow into mixing chamber 400 at variable proportions based on positioning of valve 300. Optionally, output from condenser 40 includes both liquid and gas. For example, while valve 300 is fully opened, gas from flow path 316 may enter mixing chamber 400 at a high flowrate and push out liquid that would otherwise flow in from main flow path 314, e.g. from condenser 40 and dryer 50. In another example, while valve 300 is closed, mixing chamber may only receive flow from main flow path 314 with no gas from flow path 316 entering mixing chamber 400. According to some example embodiments, output from mixing chamber 400 directs flow into metering device 60 and through evaporator 70. The cooling effect afforded by evaporator 70 may depend on a proportion of gas and liquid flowing into evaporator 70. A mixture including proportionately more liquid (and less gas) may provide more cooling as compared to a mixture including proportionately less liquid (and more gas). Temperature may be sensed with one or more sensors 90 and controller 10 may adjust opening of valve 10 based on input from one or more sensors 90 to dynamically regulate the temperature.

According to some example embodiments, refrigeration cycle 100 provides a relatively fast temperature response due the ability to alter the proportion between gas and liquid on-the-fly. Typically, a cooling effect provided the evaporator is directly related to the proportion of liquid within the evaporator. By altering that proportion on the fly, the cooling rate provided by the evaporator may also be altered on the fly.

According to some example embodiments, during operation compressor 30 may be configured to be operated at a constant rate regardless of the cooling rate and/or temperature that is desired to be obtained. Rather a desired cooling rate and/or temperature may be achieved based on altering the proportion flow into evaporator 70, for example by controlling opening and closing of valve 300.

Figure 2A:
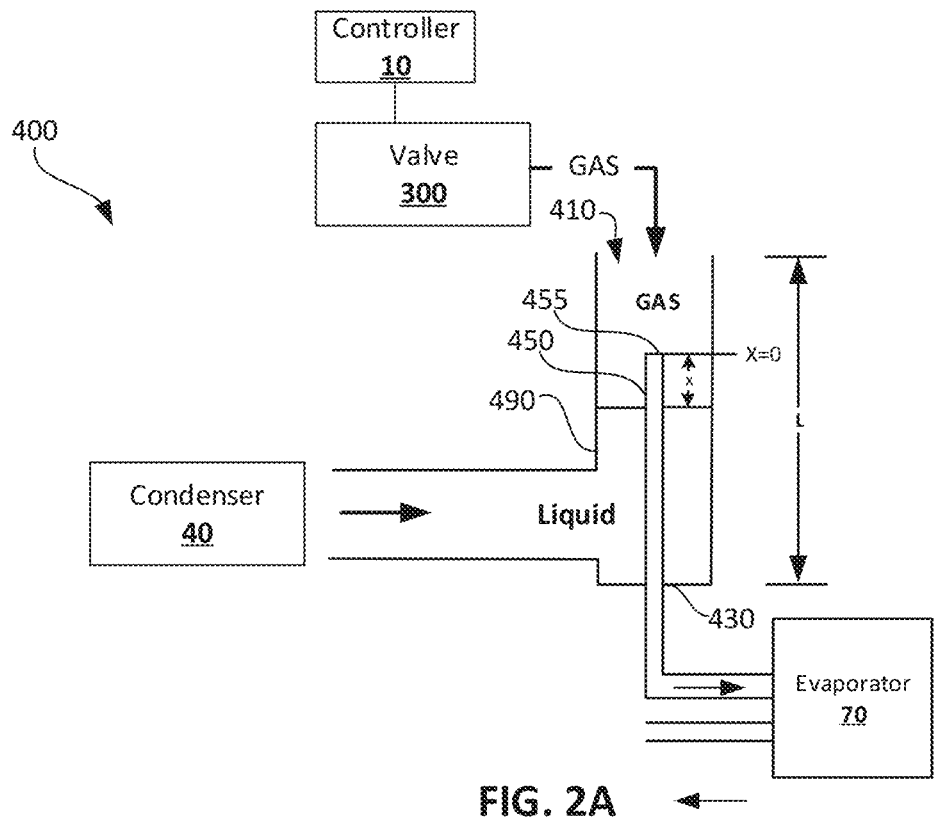
FIGS. 2A and 2B are simplified schematic drawings showing flow through an example mixing chamber while a gas flow control valve of the refrigeration cycle is open and closed respectively, both in accordance with some example embodiments.
Figure 2B:
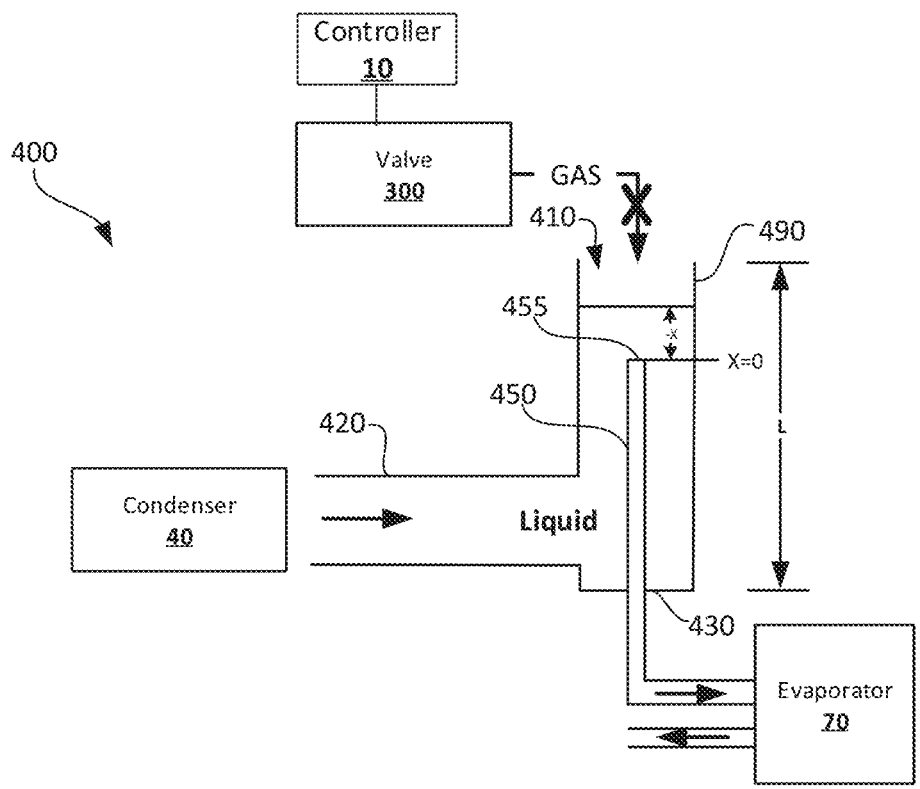

Reference is now made to FIGS. 2A and 2B schematically showing example flow through an example mixing chamber while gas flow control valve of the refrigeration cycle is open and closed respectively, both in accordance with some example embodiments. According to some example embodiments, mixing chamber 400 includes a housing 490 with a liquid inlet port 420 fluidly connected to main flow path 314 configured to receive liquid flow from condenser 40 (and optionally dryer 50), a gas inlet port 410 receiving gas flow from flow path 316 through which flow is regulated by controller 10 with valve 300, and an outlet port 430 through which a tube 450 is introduced into a volume of housing 490. Outflow from mixing chamber 400 is through tube 450 with tube inlet 455 and may be directed to evaporator 70 via a metering device. Optionally, tube 450 is integral to metering device 60 (FIG. 1). Optionally, tube 450 is a capillary tube or is another tube fitted on a capillary tube. Diameter of tube 450 may be selected based on system requirements. Example diameters may be 0.1 mm to 10 mm.

Housing 490 may have an elongated shape with height L and tube inlet 455 of tube 450 may be positioned within housing 490 at a defined height X=0. Optionally, outlet port 430 is at a bottom portion of mixing chamber and tube 450 extends into housing 490 vertically through outlet port 430 and is fixedly positioned with tube inlet 455 at height X=0. According to some example embodiments, a height 'x' of liquid in relation to tube inlet 455 may be controlled by controlling opening of valve 300.

In one example extreme state shown in FIG. 2A, valve 300 may be fully opened (i.e. providing minimal resistance to flow) and hot refrigerant in vapor state may flow at substantially full pressure supplied by compressor 30 through gas inlet port 410 into mixing chamber 400. Concurrently, flow from main flow path 314 reaches mixing chamber at a substantially lower pressure and temperature. The lower pressure is due for example to a flow resistance through condenser 40 and optionally dryer 50 as well as due shrinkage in volume that results from the condensation. In some example embodiments, the higher gas pressure may push a level of liquid to a height X below tube inlet 455 in tube 450. In this example state, only gas would flow through tube 450 into evaporator 70. Typically, pressure within mixing chamber 400 is maintained at a steady pressure with a level of the liquid within mixing chamber 400 (height X) varying based on pressure from gas flowing into gas inlet port 410.

In another example extreme state shown in FIG. 2B, valve 300 is fully closed (i.e. has infinite resistance to flow) and substantially no refrigerant flows from flow path 316 and into gas inlet port 410. Instead, liquid flow (or a mix of liquid and gas) from main flow path 314 may flow through liquid inlet port 420 and may substantially fill mixing chamber 400. Flow through liquid inlet port 420 may be free to flow in the absence of any counter pressure from gas flowing through gas inlet port 410. Liquid refrigerant in this case may rise to a height '−x' in relation to tube inlet 455 of tube 450. In this state, only liquid may flow into evaporator 70. While only liquid flows into the evaporator, cooling system 100 may operate in a manner that is similar to conventional cooling systems.

Generally there may be intermediate operational states, between the extreme states described above and corresponding to intermediate opening states of flow control valve 300. In such states, gas flows through bypass flow path 316 into gas inlet port 410 at a rate that is lower than the rate at which compressor 30 draws refrigerant through evaporator 70 from the metering device 60 (FIG. 1). In such states, the pressure within mixing chamber 400 drops and liquid is drawn into the mixing chamber 400 through liquid inlet port 420 until its level rises and reaches the level of tube inlet 455, at which point it may flow intermixed with the flowing gas into the tube 450 and evaporator 70. A liquid flow rate is then automatically maintained such that, on the average, the total flow rate (i.e. the sum of the flow rates of gas and liquid) is determined by the action of the compressor, whereby the average pressure maintained within the mixing chamber keeps the level of the liquid at the level of tube inlet 455. Any change in the settings of the flow control level may cause a change in the gas flow rate, which in turn may cause an inverse change in the liquid flow rate—bringing about a corresponding change in the proportion of liquid to gas in the metering device and the resulting change of the cooling effect in the evaporator.

For each intermediate state, as described above, there may occur short term limited variations in the flow rates, about the corresponding average values, which may be due to hydrodynamic instabilities, non-linear effects in the flow of liquid into the intake and boiling of some of the cool liquid upon contact with the hot gas—causing some bubbling.

The present inventors have found that when a height of the liquid is at or near a height of tube inlet 455, the liquid refrigerant undergoes local boiling which varies a proportion between the rates of flow of liquid and vapor over time. The proportions may vary over time in an oscillatory or random pattern. The prevent inventors have found that while the rates of flow of liquid and gas into tube inlet 455 may vary due to boiling, flow into the evaporator has an averaging affect and the cooling provided by the evaporator is substantially stable.

According to some example embodiments, a proportion between the rates of flow of liquid and vapor into tube 450 and into evaporator 70 may be dynamically regulated based on a desired cooling rate and/or temperature. In some example embodiments, variable proportion between the rates of flow of liquid and vapor into tube 450 is controlled based on controlling a degree of opening of valve 300. The pressure applied by gas flowing into mixing chamber 400 sets a height X of liquid.

According to some example embodiments, the varying ratio between the flow rates of the cool liquid part and the hot gaseous part of the refrigerant, alters a ratio between cool liquid and hot gas and thereby an average temperature of the mixture flowing out of mixing chamber 400 into evaporator 70 (via metering device 60). This variation in temperature may effect a cooling rate in the evaporator. Furthermore, as this mixture enters evaporator 70, only the liquid part of the mixture evaporates and extracts heat. As such the cooling effect and/or rate of heat extraction by evaporator 70 may depend on the amount of liquid in the mixture at any one time. Optionally, the dependence may be directly proportional to amount of liquid in the mixture.

Figure 3A:
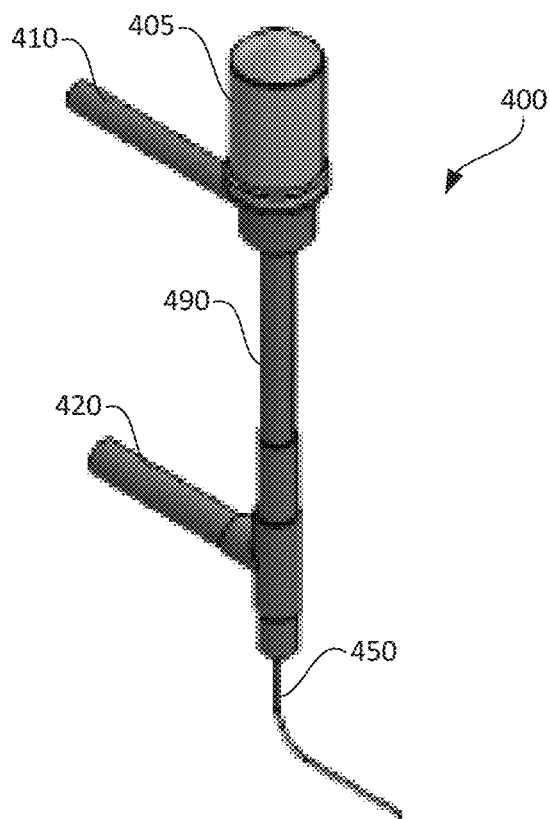
FIGS. 3A and 3B are perspective and cross sectional views respectively of an example mixing chamber, both in accordance with some example embodiments.
Figure 3B:
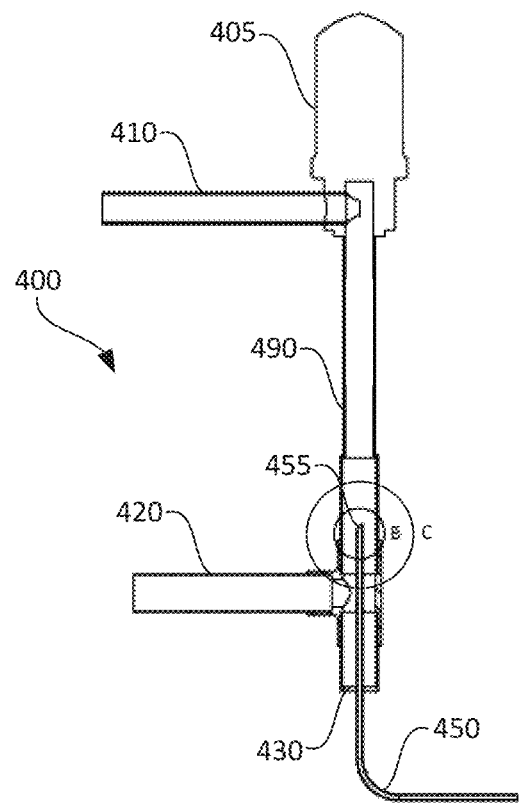

Reference is now made to FIGS. 3A and 3B showing perspective and a cross sectional views respectively of an example mixing chamber, both in accordance with some example embodiments. According to some example embodiments, mixing chamber 400 includes housing 490, gas inlet port 410 configured to receive gas from gas flow path 316 and liquid inlet port 420 configured to receive liquid from main flow path 314 post condensation. Valve actuator 405 controls flow of gas through gas inlet port 410 into housing 490. According to some example embodiments, mixing chamber 400 additionally includes a tube 450, e.g. a capillary tube or other tube penetrating into housing 490 and providing a flow channel for outflow from mixing chamber 400. According to some example embodiments, housing 490 is elongated in a vertical direction with liquid inlet port 420 positioned in a bottom half of housing 490 and gas inlet 410 positioned in an upper half of housing 490. Optionally, tube 450 penetrates through a floor or base of housing 490 via an outlet port 430. In other example embodiments, tube 450 may penetrate through a wall of housing 490 above the floor or base, e.g. tube 450 may penetrate through a wall of housing 490 at height X=0.

Figure 4A:
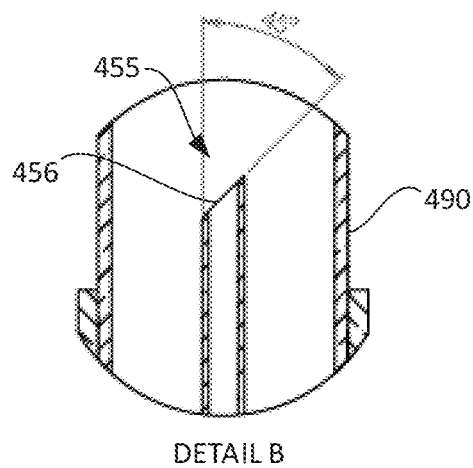
FIGS. 4A, 4B and 4C are example structural variations for an inlet into a tube extending into the mixing chamber and directing flow into the evaporator, all in accordance with some embodiments.
Figure 4B:
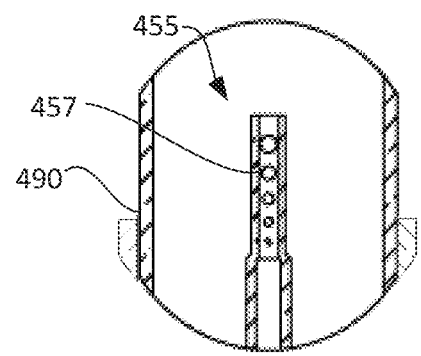
Figure 4C:
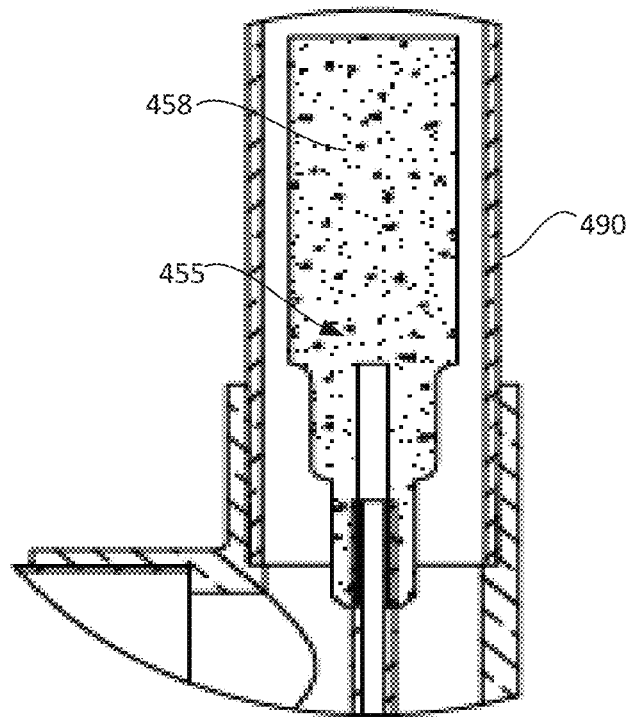

Reference is now made to FIGS. 4A, 4B and 4C showing example structural variations for an inlet into a tube extending into the mixing chamber and directing flow into the evaporator, all in accordance with some embodiments. According to some example embodiments, tube inlet 455 at a tip of tube 450 may be designed in different configurations. Optionally, a specified configuration may provide for improving stability and/or response speed of temperature regulation based on shorting the time over which variations in liquid/gas flow rates are averaged. In some example shown in FIG. 4A, tube inlet 455 may be angled for example in a defined angle, e.g. 45°. In other example embodiments, tube inlet 455 may additionally or alternatively include a plurality of perforations 457 through which liquid and gas may flow. In yet another example embodiments, tube inlet 455 may be covered with a porous cover 458 through which gas and liquid refrigerant may penetrate. In each case the height of the liquid level at equilibrium may rise in correspondence with the opening of valve 300, thus widening an aperture through which the liquid may flow into tube 450 and providing a more stable flow rate, e.g. with less short term fluctuations.

Figure 5:
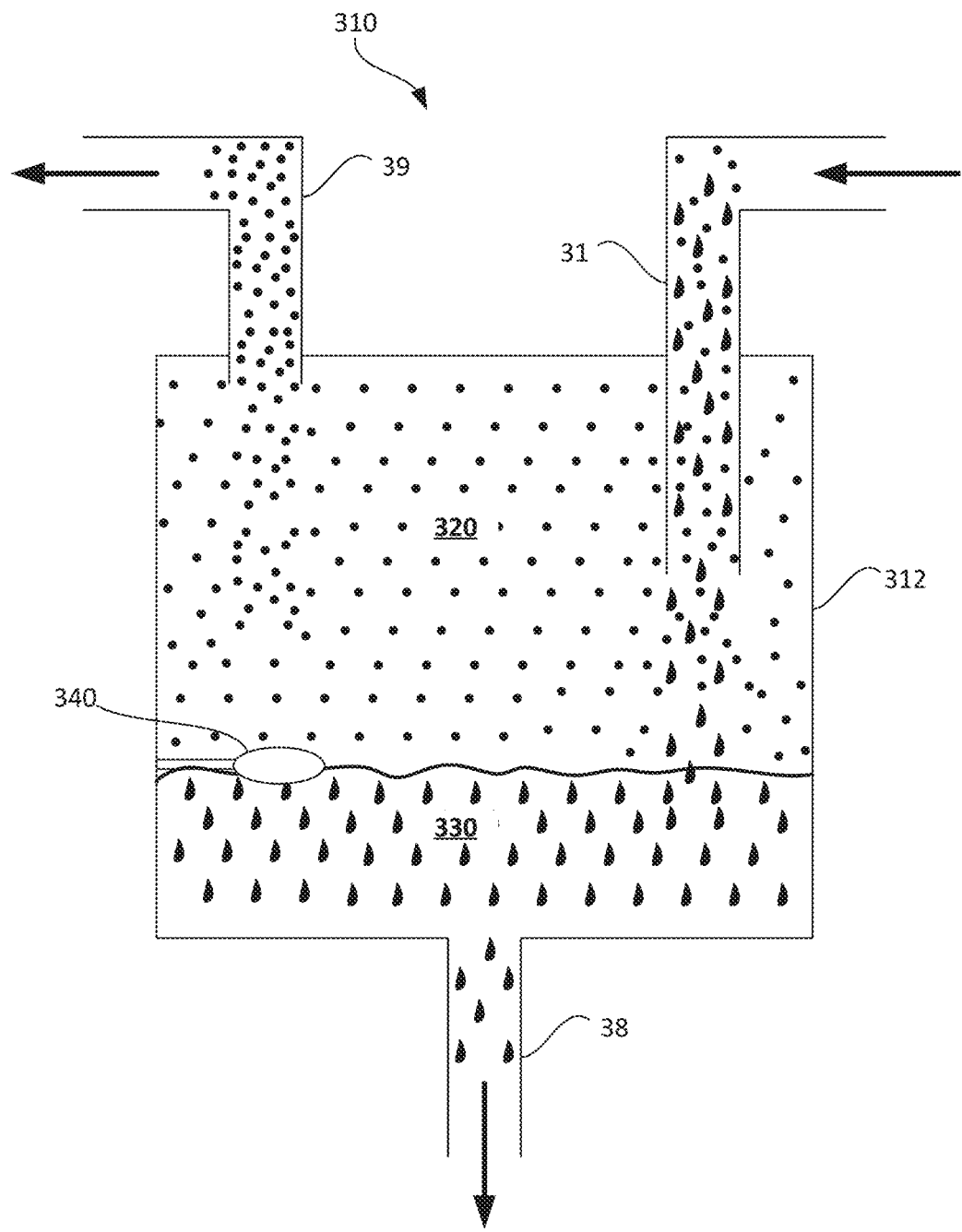
FIG. 5 is a schematic drawing of an example gas-liquid separator in accordance with some example embodiments.

Reference is now made to FIG. 5 showing a schematic drawing of an example gas-liquid separator in accordance with some example embodiments. In some example embodiments, refrigeration cycle 100 (FIG. 1) includes a vapor-liquid separator 310. Optionally, vapor-liquid separator 310 includes a housing 312 in which hot gas 320 and liquid 330 from compressor 30 may flow via a bi-phase flow channel 31 extending from compressor 30 into housing 312. Bi-phase refrigerant may collect in housing 312 with liquid 330 settling at a bottom of housing 312 due to gravity and gas 320 hovering above liquid 330. Optionally, a liquid outlet 38 positioned at a base or bottom portion of housing 312 may allow free flow of liquid 330 out of housing 312 and a gas outlet 39 at an upper portion, e.g. an upper half of housing 312 may direct gas flow through gas flow path 316. Flowrate of gas 320 may be controlled by valve 300 (FIG. 1). Optionally, vapor-liquid separator 310 may include a level sensor 340 configured to monitor a level of liquid in housing 312. Alternatively, level sensor 340 is not required. Optionally, liquid outlet 38 may also be associated with a control valve configured to controllably restrict liquid flow out of housing 312.

Figure 6A:
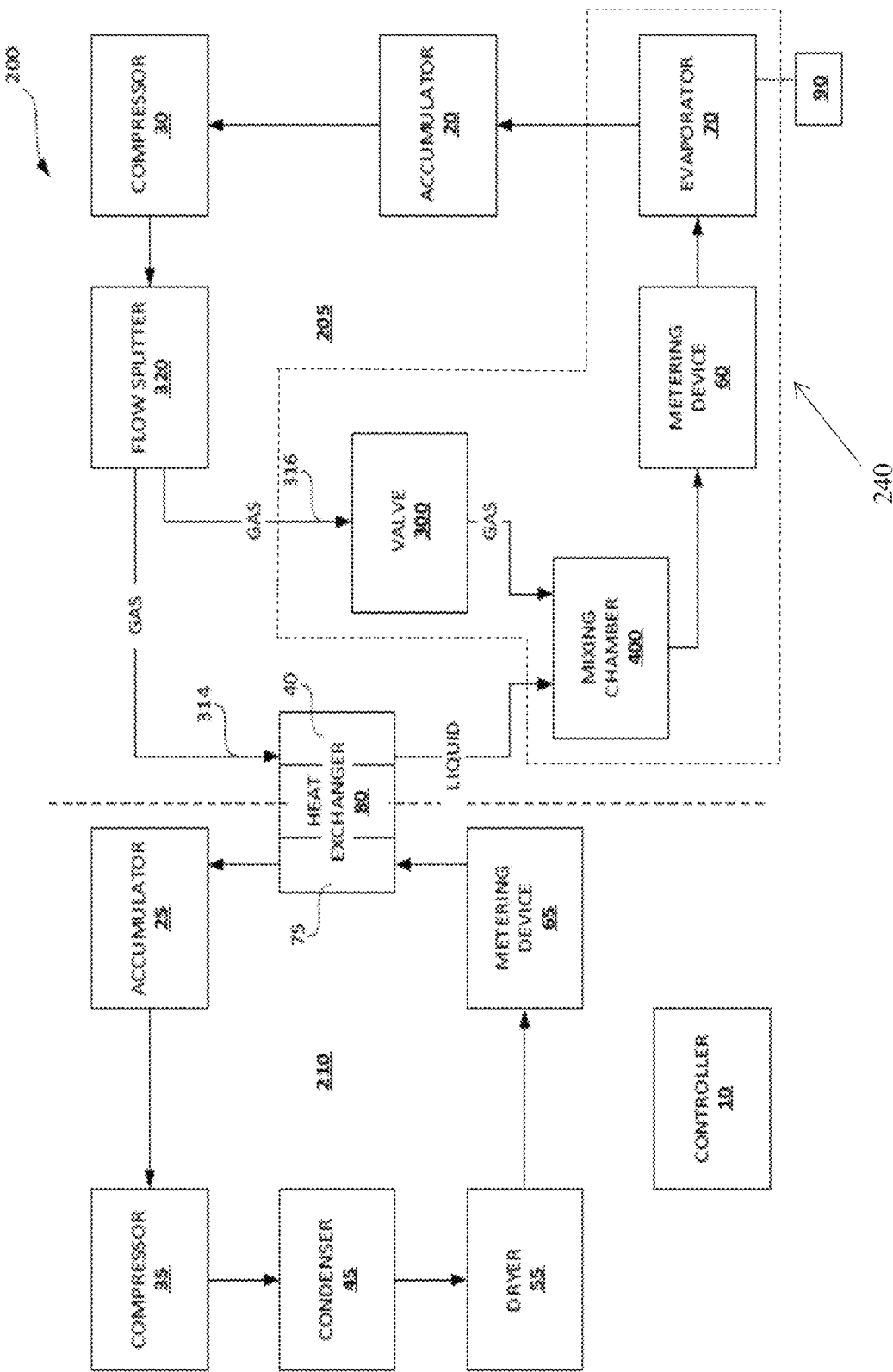
FIGS. 6A-6B are simplified block diagrams of an example dual loop refrigeration cycle in accordance with some example embodiments.
Figure 6B:
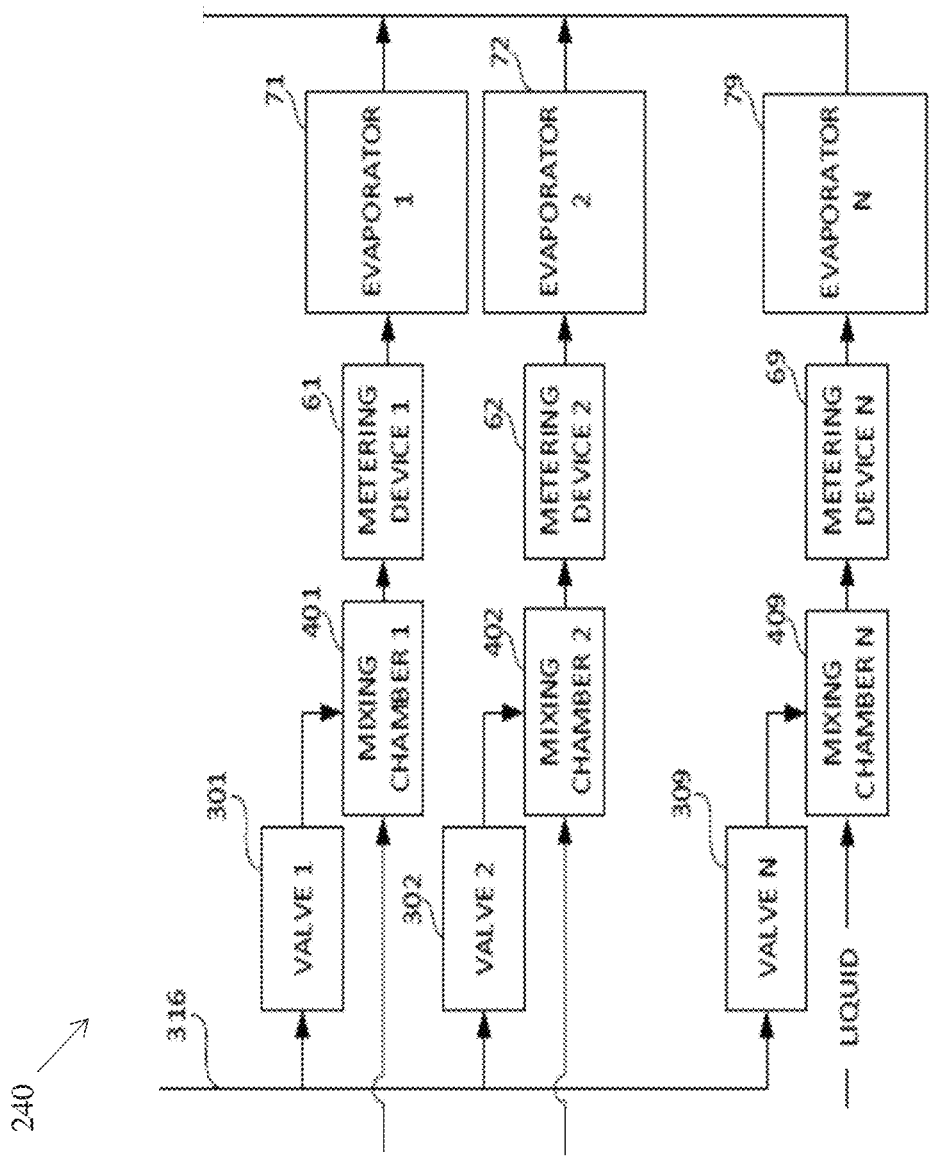

Reference is now made to FIGS. 6A-6B showing a simplified block diagram of an example dual loop refrigeration cycle in accordance with some example embodiments. Dashed line 240 surrounds a portion of first main refrigeration cycle 205 which may contain a single bypass flow path or multiple sub-bypass flow paths. FIG. 6A illustrates a portion 240 which includes a single bypass flow path with valve, mixing chamber, metering device and evaporator. FIG. 6B illustrates a portion 240 which includes multiple sub-bypass flow paths, with respective valves, mixing chambers, metering devices and evaporators as described in more detail below.

According to some example embodiments, a wider range of cooling temperatures including lower temperature cooling may be achieved with a dual loop refrigeration cycle 200. Refrigeration cycle 200 together with controller 10 form an example cooling system. Sensors 90 when present may also be part of the cooling system. Dual loop refrigeration cycle 200 includes a first main refrigeration cycle 205 that exchanges heat with an auxiliary refrigeration cycle 210. Auxiliary refrigeration cycle 210 may circulate a refrigerant between an accumulator 25 configured to extract refrigerant from a heat exchanger, a compressor 35, an auxiliary cycle condenser 45, optionally a dryer 55, a metering device 65 and heat exchanger 80. Heat exchanger 80 may be coupled with an auxiliary cycle evaporator 75 through which second refrigerant of auxiliary refrigeration cycle 210 flows and a condenser 40 through which first refrigerant of main refrigeration cycle 210 flows. Heat exchanger 80 may exchange heat with main refrigeration cycle 205 to extract heat and condense first refrigerant gas flowing in main refrigeration cycle 205. Optionally, second refrigerant in auxiliary refrigeration cycle 210 flows through dedicated auxiliary cycle evaporator 75 that is configured to exchange heat with condenser 40. Controller 10 may control operation of both auxiliary refrigeration cycle 210 and main refrigeration cycle 205 to achieve a desired cooling rate and temperature at evaporator 70 in main refrigeration cycle 205.

FIG. 6B shows a plurality of separately controlled evaporators, each evaporator may receive bi-phase refrigerant flow from a dedicated mixing chamber, e.g. mixing chamber 401, 402 and 409 and dedicated metering device, e.g. metering device 61, 62 and 69. According to some example embodiments, each dedicated mixing chamber, e.g. mixing chamber 401, 402 and 409 is associated with a dedicated valve, e.g. valve 301, 302 and 309 configured to selectively regulate gas flow rate into its mixing chamber. Refrigerant flows from the metering devices to respective evaporators 71, 72 and 79, each of which may be separately controlled.

According to some example embodiments, main refrigeration cycle 205 is operated with a first refrigerant that is configured to be in a substantially gaseous phase when it flows out from the compressor due to its relatively low boiling temperature. The lower boiling temperature provides for achieving lower cooling temperatures. Since outflow from compressor 30 is in a gaseous phase, there is no need to separate liquid to create gas flow path 316. Instead, the vapor emerging from the compressor passes through flow splitter or filter 320 that splits the flow path into a main flow path 314 and a bypass flow path 316. Optionally, the flow is split with approximately 50% flowing through main flow path 314 and 50% flowing through bypass flow path 316. However other flow proportions may be contemplated. In some example embodiments, gas flow through main flow path 314 is condensed into a liquid phase through heat exchanger 80, while gas flow through flow path 316 is maintained in its gaseous phase. Gas in flow path 316 may also be hot gas as it is received from compressor 30. In some example embodiments, gas flow through main flow path 314 may flow through a dedicated condenser that exchanges heat with heat exchanger 80. Optionally, heat exchanger 80 includes auxiliary cycle evaporator 75 through which second refrigerant from auxiliary refrigeration cycle 210 flows, condenser 40 through which first refrigerant from main refrigeration cycle 205 flows and thermal coupling therebetween configured to facilitate transfer of heat from condenser 40 to auxiliary cycle evaporator 75.

According to some example embodiments, liquid from heat exchanger 80 and gas from flow path 316 is controllably combined in mixing chamber 400 based on controlling valve 300 and the combined flow is directed to metering device 60 and auxiliary cycle evaporator 70 as described herein above. According to some example embodiments, a wider working range of temperatures may be achieved based on dual loop refrigeration cycle. For example, highest temperature (minimum cooling) may be achieved while valve 300 is fully opened and evaporator 70 may be filled with refrigerant in a gaseous state. Lowest temperature (maximum cooling) may be achieved while valve 300 is closed and evaporator 70 is filled with refrigerant in a liquid state. When first refrigerant with relatively low boiling temperature is used for main refrigeration cycle 205, the temperature of the liquid refrigerant is relatively low and the temperature span between the highest and lowest temperature is wider. By selectively opening valve 300, a variety or span of temperatures between the two extreme temperatures may be controllably reached. Controller 10 may control operation of both auxiliary refrigeration cycle 210 and main refrigeration cycle 205 to obtain a desired temperature and cooling rate at evaporator 70.

Figure 7:
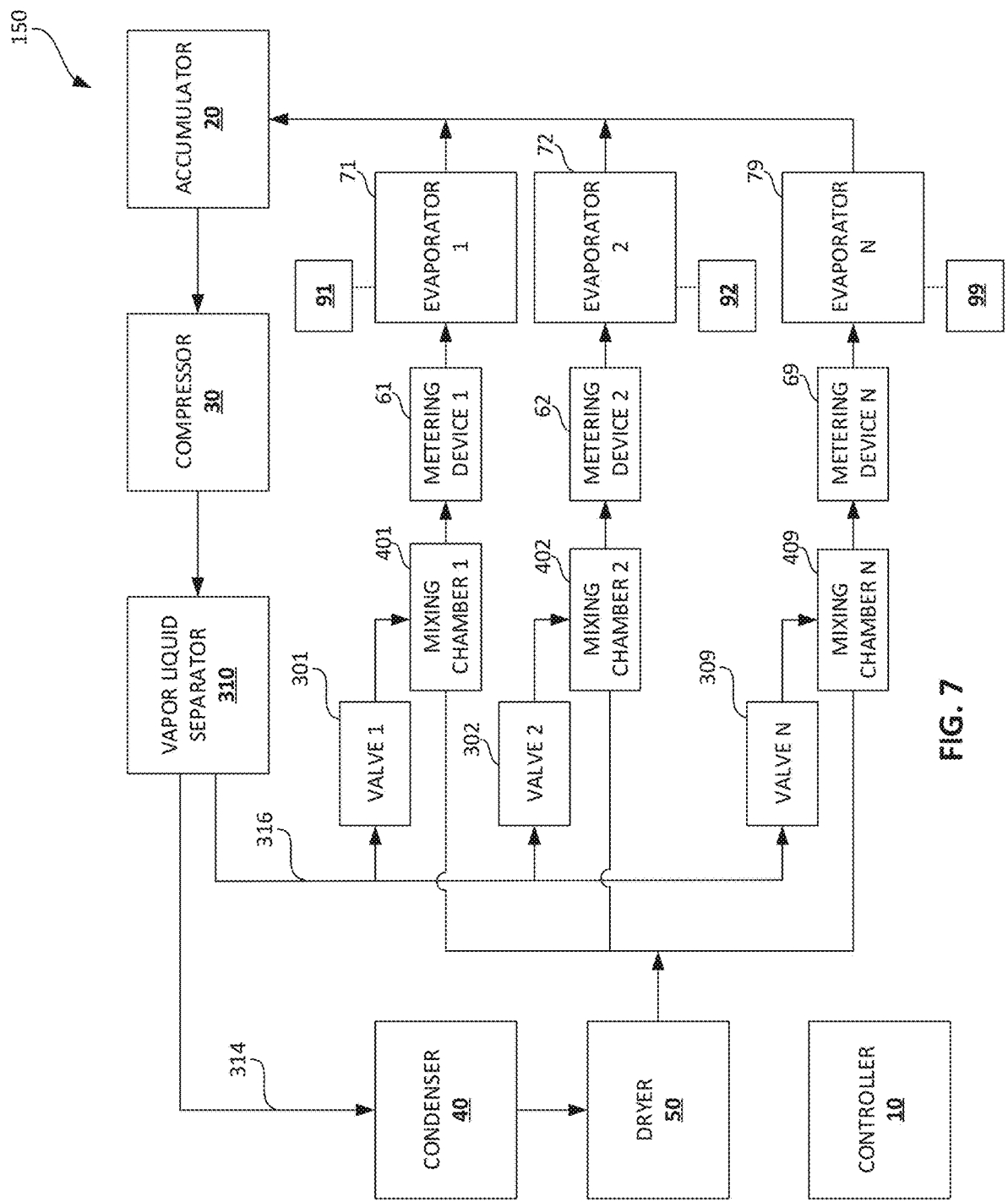
FIG. 7 is a simplified block diagram of an example single loop refrigeration cycle including a plurality of separately controlled evaporators in accordance with some example embodiments.

Reference is now made to FIG. 7 showing a simplified block diagram of an example single loop refrigeration cycle operated with a plurality of separately controlled evaporators in accordance with some example embodiments. According to some example embodiments, a same refrigeration cycle may be operated to separately cool a plurality of different bodies and volumes or different spaces. According to some example embodiments, refrigeration cycle 150 is similar to operation to refrigeration cycle 100 (FIG. 1) with the addition of a multiple evaporators, e.g. evaporator 71, 72 and 79, each of which may be separately controlled. Refrigeration cycle 150 together with controller 10 form an example cooling system. Sensors 90 when present may also be part of the cooling system. In some example embodiments, each evaporator may receive bi-phase refrigerant flow from a dedicated mixing chamber, e.g. mixing chamber 401, 402 and 409 and dedicated metering device, e.g. metering device 61, 62 and 69. Each dedicated mixing chamber, e.g. mixing chamber 401, 402 and 409 is associated with a dedicated valve, e.g. valve 301, 302 and 309 configured to selectively regulate gas flow rate from a common compressor 30 into its mixing chamber.

Optionally, liquid refrigerant in main flow path 314 may freely flow into each of the dedicated mixing chambers. In this manner each evaporator may provide cooling at a different rate and temperature. In some example embodiments, dedicated sensors, e.g. sensors 91, 92, and 99 may provide input for regulating each of the evaporators. Optionally, controller 10 is configured to control operation of refrigeration cycle 150 including separately controlling each of valves 301, 302 and 309. In some example embodiments output from each of the evaporators may be suctioned by a single accumulator 20 and compressed by a same compressor 30 and condensed by a same condenser 40 and optionally dryer 50. According to some example embodiments, compressor 30 is configured to be operated at a constant rate while providing different levels of cooling at each evaporator. In alternate example embodiments, when a single valve 300 and single mixing chamber 400 may feed a portion of the evaporators. In yet other example embodiments, a refrigerant cycle may include a plurality of groups of evaporators, with evaporators in a same group being commonly controlled and evaporators in different groups being separately controlled.

Figure 8:
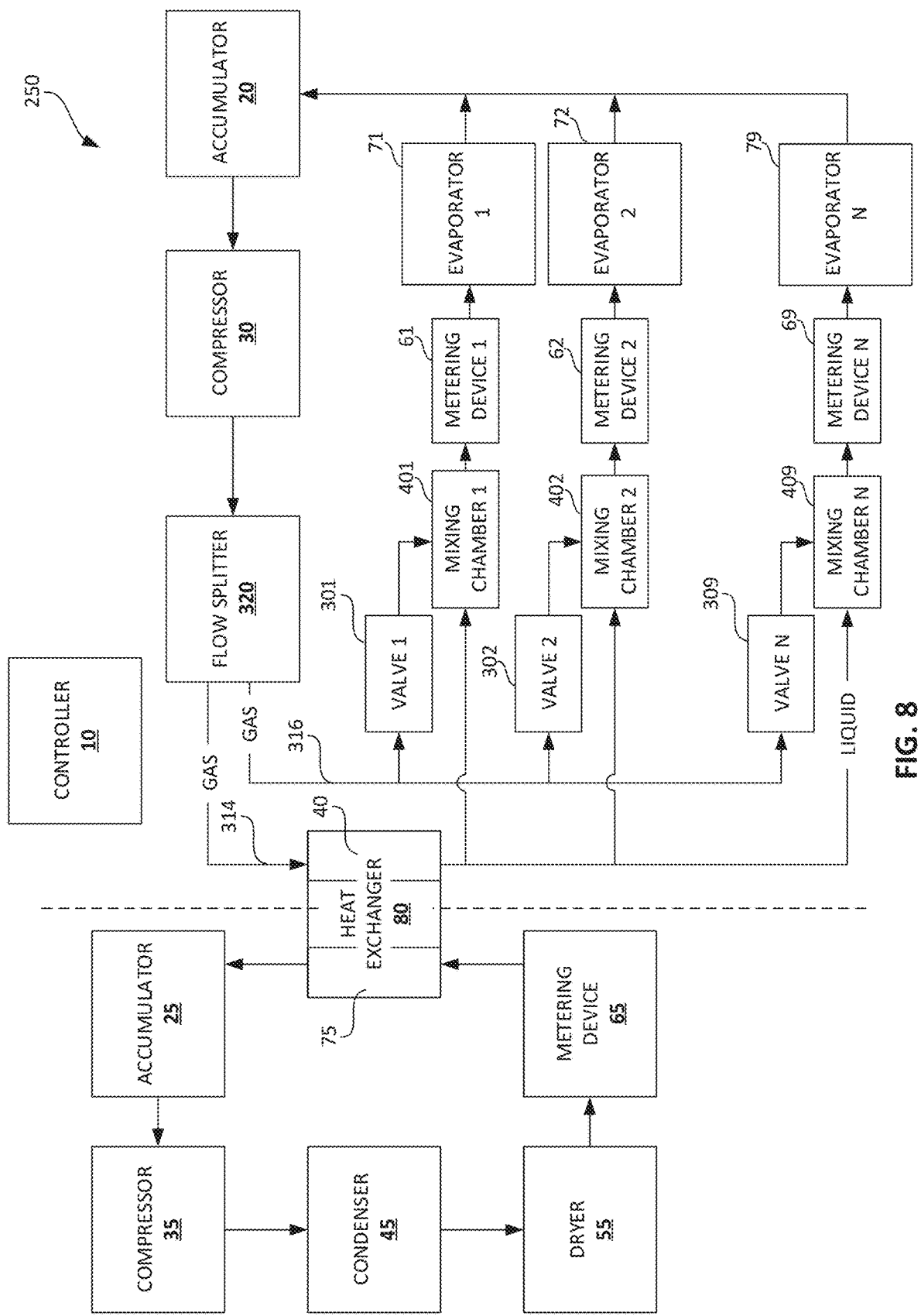
FIG. 8 is a simplified block diagram of an example double loop refrigeration cycle including a plurality of separately controlled evaporators in accordance with some example embodiments.

Reference is now made to FIG. 8 showing a simplified block diagram of an example double loop refrigeration cycle operated with a plurality of separately controlled evaporators in accordance with some example embodiments. According to some example embodiments, refrigeration cycle 250 may be similar to refrigeration cycle 205 with the addition of multiple evaporators, e.g. evaporators 71, 72 and 79 each of which may be separately controlled. Refrigeration cycle 250 together with controller 10 form an example cooling system. Sensors 90 when present may also be part of the cooling system. As explained in reference to FIG. 8 that similarly shows a plurality of separately controlled evaporators, each evaporator may receive bi-phase refrigerant flow from a dedicated mixing chamber, e.g. mixing chamber 401, 402 and 409 and dedicated metering device, e.g. metering device 61, 62 and 69. According to some example embodiments, each dedicated mixing chamber, e.g. mixing chamber 401, 402 and 409 is associated with a dedicated valve, e.g. valve 301, 302 and 309 configured to selectively regulate gas flow rate into its mixing chamber. Optionally, liquid refrigerant in main flow path 314 may freely flow into each of the dedicated mixing chambers. In some example embodiments, dedicate sensors, e.g. sensors 91, 92, and 99 may provide input for regulating each of the evaporators. Optionally, controller 10 is configured to control operation of refrigeration cycle 150 including separately controlling each of valves 301, 302 and 309. In some example embodiments output from each of the evaporators may be suctioned by a single accumulator 20 and compressed by a same compressor 30 and condensed by a same heat exchanger 80. Optionally, the vapor-liquid separator may also be common to each of the flow paths reach the different evaporators. In alternate example embodiments, when separate control is not required, a refrigeration cycle may include a single valve 300 and single mixing chamber 400 that is configured to feed a plurality of evaporators. In yet other example embodiments, a refrigeration cycle may include a plurality of groups of evaporators with evaporators in a same group being commonly controlled and evaporators in different groups being separately controlled.

Figure 9:
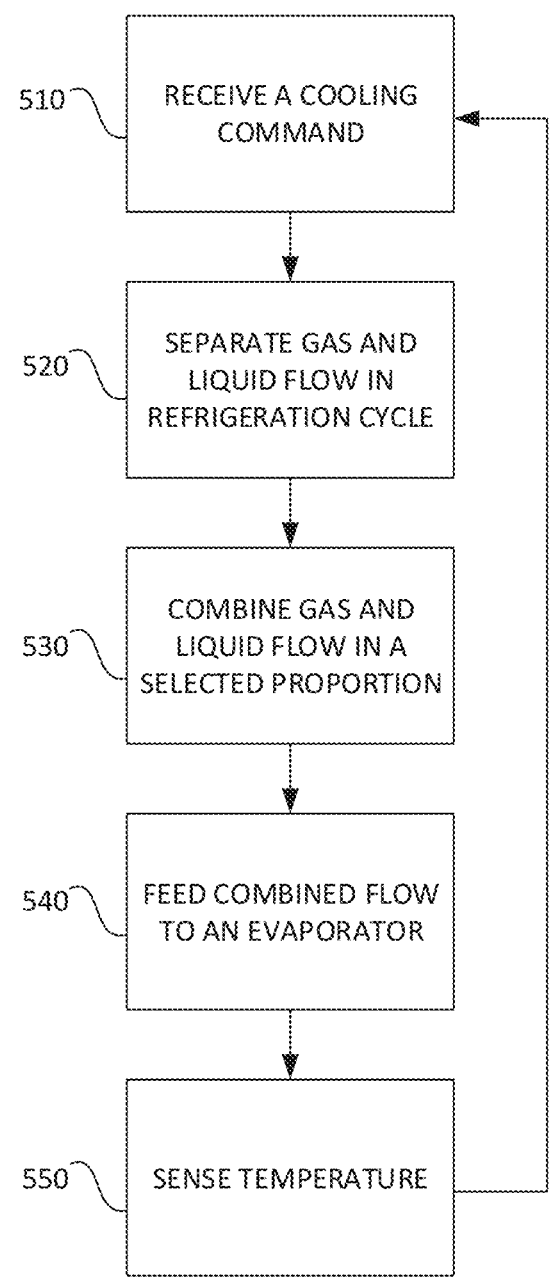
FIG. 9 is a simplified flow chart of an example method to regulate temperature in accordance with some example embodiments.

Reference is now made to FIG. 9 showing a simplified flow chart of an example method to regulate temperature in accordance with some example embodiments. According to some example embodiments, a cooling command such as a desired temperature and/or a desired cooling rate may be defined by a user or by a computer based on temperature sensing (block 510). In order to achieve the selected cooling parameter, a separate flow path for gas and liquid refrigerant is established (block 520). In some example embodiments, separate flow paths may be achieved by separating a bi-phase mixture of refrigerant, e.g. with a vapor-liquid separator emerging from a compressor. In other example embodiments, the separate flow paths may be achieved by directing only a portion of gaseous flow emerging from the compressor to a heat exchanger or a condenser to condense into a liquid while diverting a remainder of the gaseous flow through a separate flow path that does not undergo condensation. According to some example embodiments, the separated flow is combined in a selected proportion (block 530). According to some example embodiments, the flow is combined in a dedicated mixing chamber and the selected proportion is achieved with a valve controlling flow of gas phase into the mixing chamber. The combined or mixed flow may then be fed into an evaporator (block 540). According to some example embodiments, the selected proportion determines temperature of bi-phase refrigerant entering an evaporator as well as a proportion of liquid refrigerant in the evaporator. Temperature and other cooling parameters may be monitored with one or more sensors (block 550) and output from the sensors may be applied for dynamically updating the cooling parameters defined (block 510). The present inventors have found that the cooling methods as described herein provides for improved temperature regulation. Optionally, a selected temperature may be maintained with an accuracy of 0.5° C. According to some example embodiments, operation of the cooling system does not require altering operation of the compressor and therefore the compressor may be operated at a constant steady state rate that is selected for with consideration of power efficiency. Furthermore, by operating the compressor at a constant steady state rate, the noise level may be reduced as compared to systems that require turning the compressor ON/OFF during its operation.

Figure 10:
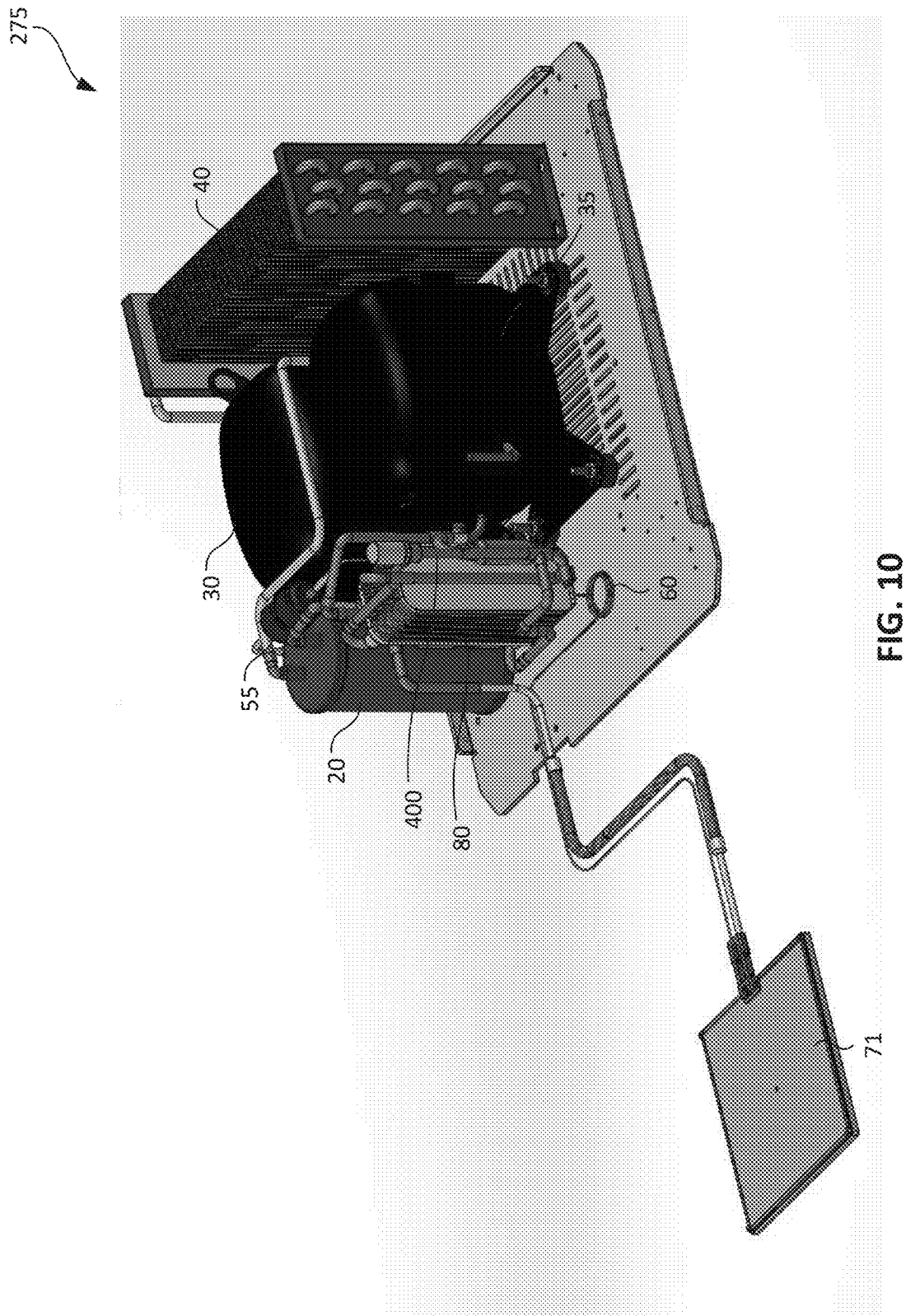
FIG. 10 is a perspective view of an example temperature forcing system including an example double loop refrigeration cycle in accordance with some example embodiments.

Reference is now made to FIG. 10 showing a perspective view of an example temperature forcing system with an example double loop refrigeration cycle in accordance with some example embodiments. According to some example embodiments, a cooling system as described herein may be a temperature forcing system for cooling semiconductor components under test. Temperature forcing system 275 may be for example a double loop refrigeration cycle similar to refrigeration cycle 200 (FIG. 6). According to some example embodiments, an evaporator shown in FIG. 10 may be in the form of a plate or may be integrated in plate a 71. Optionally, plate 71 is configured to be in physical contact with semiconductor components under test. In some example embodiments, plate 71 may also include a heating system that includes a heating element. Temperature forcing system may selectively operate one of refrigeration cycle 275 and heating system to test the semiconductor component in different extreme temperatures.

Figure 11A:
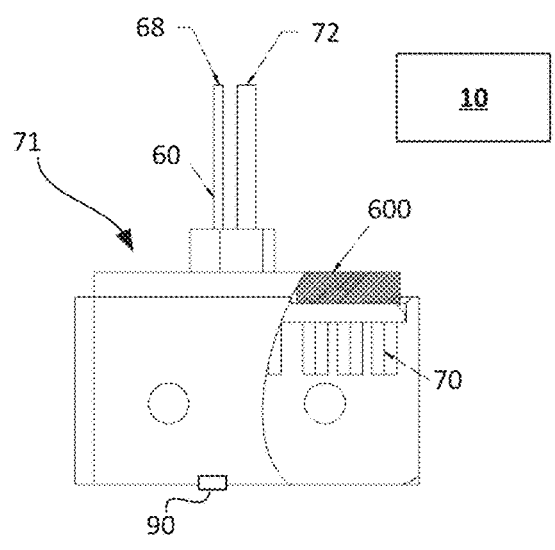
FIGS. 11A, 11B and 11C are three example configurations for integrating a heating coil on a temperature forcing plate in accordance with some example embodiments.
Figure 11B:
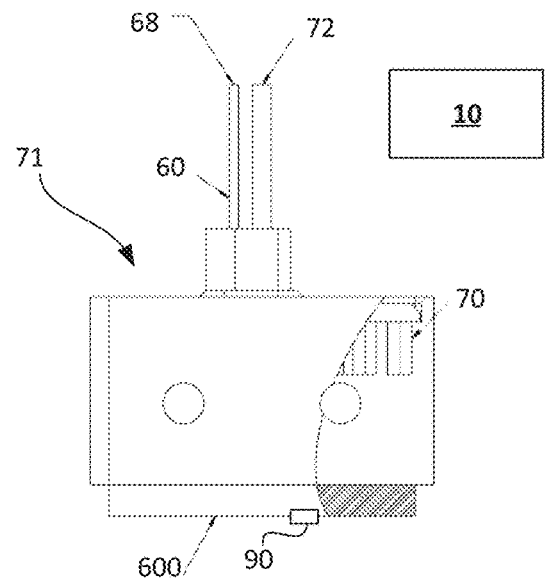
Figure 11C:
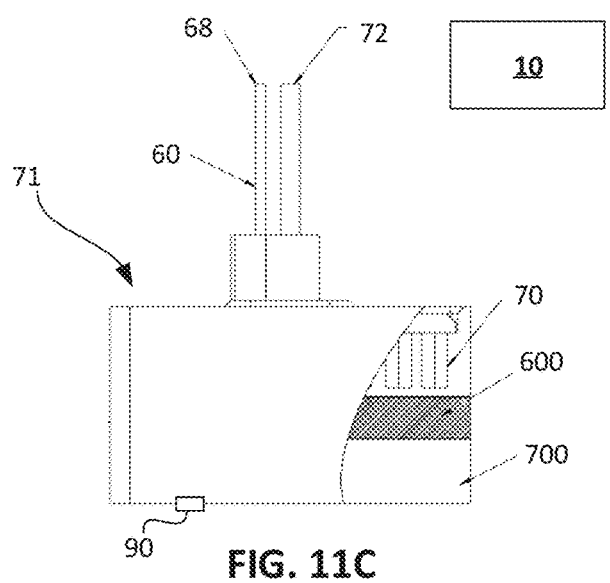

Reference is now made to FIGS. 11A, 11B and 11C showing three example configurations for integrating a heating coil on a temperature forcing plate in accordance with some example embodiments. In some example embodiments, a temperature forcing system for cooling semiconductor components under test additionally includes a heating coil that is configured to heat the semiconductor component under test. In some example embodiments, temperature forcing plate 71 is thermally coupled to both an evaporator 70 for cooling as well as a heating coil 600 for heating. The heating coil 600 may optionally be overlaid above evaporator 70 with the evaporator 70 being closest to the component being tested as shown in FIG. 11A, overlaid on a bottom of evaporator 70 as shown in FIG. 11B or may be sandwiched between evaporator 70 and a control plate 700 (FIG. 11C). Flow 68 in evaporator 70 via capillary tube 60 and flow 72 out of evaporator 70 may be from above distal to the component being tested. According to some example embodiments, controller 10 as described herein is additionally configured to control operation of heating coil. In some example embodiments, controller 10 is configured to operate the cooling system with substantially only gas in the evaporator while activating heating coil 700. Optionally, one or more temperature sensors 90 are configured to provide feedback to controller 10 based on which operation of both the cooling and heating may be adjusted.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements. In addition, any priority document(s) of this application is/are hereby incorporated herein by reference in its/their entirety.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the Applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A cooling system, comprising a main refrigeration cycle and an auxiliary refrigeration cycle, the main refrigeration cycle comprising:
   a first refrigerant;
   a first accumulator, a first compressor, a first condenser, a mixing chamber, a metering device and a first evaporator, all fluidly connected in sequence within a main flow path, configured to circulate the first refrigerant therein;
   a bypass flow path into which the system is configured to divert a portion of first refrigerant flow from a location on the main flow path that is downstream from the first compressor and upstream from the first condenser;
   a valve configured to control flow through the bypass flow path; and
   a controller configured to dynamically control operation of the valve;
   wherein the auxiliary refrigeration cycle comprises:
      a second refrigerant; and
      a second evaporator, thermally coupled to the first condenser and configured to enable the second refrigerant, flowing through the second evaporator, dissipate heat from the first refrigerant, flowing through the first condenser, and wherein the mixing chamber is configured to receive refrigerant from the first condenser and from the bypass flow path and to direct outflow of liquid refrigerant and gas refrigerant from the mixing chamber through the metering device to the first evaporator, and wherein a ratio of said liquid refrigerant and said gas refrigerant in said outflow of said mixing chamber is controllable by said controller.

2. The cooling system of claim 1, comprising a flow splitter configured to divide outflow from the first compressor between the main flow path and the bypass flow path, wherein the outflow from the first compressor is fully vaporized.

3. The cooling system of claim 1, wherein the refrigerant flowing through the first condenser is condensed into liquid phase.

4. The cooling system of claim 1, wherein the portion of flow through the bypass flow path is gaseous flow.

5. The cooling system of claim 1, wherein the boiling temperature of the first refrigerant is no greater than 10 degrees Celsius.

6. The cooling system of claim 1, comprising a sensor configured to sense a cooling effect of the cooling system, wherein the controller is configured to receive input from the sensor and to regulate the valve based on the input.

7. The cooling system of claim 1, wherein the first refrigerant is configured to emerge from the first compressor entirely in a gaseous phase.

8. The cooling system of claim 1, wherein said controller is configured to receive commands from a user operating said cooling system via a user interface.

9. The cooling system of claim 1, wherein said controller is also configured to control operation of said auxiliary refrigeration cycle to affect cooling rate and temperature at said first evaporator.

10. The cooling system of claim 1, wherein the mixing chamber comprises:
a first inlet configured to receive flow from a location along the main flow path that is downstream from the first condenser and upstream from the first evaporator;
a second inlet configured to receive flow from the bypass flow path; and
an outlet configured to direct flow from one or more of the first inlet and the second inlet to the metering device.

11. The cooling system of claim 10, wherein the mixing chamber is elongated in a vertical direction and wherein the first inlet is positioned below the second inlet.

12. The cooling system of claim 1, wherein outflow from the mixing chamber is through a tube including an open tip penetrating within the mixing chamber, wherein the tip is positioned at a defined height within the mixing chamber.

13. The cooling system of claim 12, wherein the tube is integral to the metering device.

14. The cooling system of claim 12, wherein the tube is a capillary tube.

15. The cooling system of claim 1, wherein said metering device comprises a plurality of metering devices and said first evaporator comprises a plurality of first evaporators, each of said first evaporators being configured to receive refrigerant flow from a corresponding one of said metering devices, wherein refrigerant from the plurality of first evaporators is collected by the accumulator.

16. The cooling system of claim 15, wherein said main refrigeration cycle comprises: a plurality of sub-bypass flow paths, each branching out from the bypass flow path; a plurality of sub-bypass valves, each of said sub-bypass valves being configured to control flow through a corresponding one of the plurality of sub-bypass flow paths; and a plurality of mixing chambers, each of said mixing chambers being configured to receive refrigerant from both the main flow path and a corresponding one of the plurality of sub-bypass flow paths and to direct outflow from the mixing chamber to a corresponding one of said evaporators.

17. The cooling system of claim 16, wherein the controller is configured to separately control each of the plurality of valves and comprising a plurality of sensors, each configured to sense a cooling effect based on a corresponding one of the plurality of evaporators, wherein the controller is configured to regulate the plurality of valves based on input from the plurality of sensors.

18. A method for cooling with a refrigerant based cooling system, the method comprising: circulating a first refrigerant in a main flow path of a main refrigeration cycle including, in sequence, a first accumulator, a first compressor, a first condenser, a mixing chamber, a metering device and a first evaporator, wherein the mixing chamber is located downstream from the first condenser and upstream from the metering device; dynamically controlling flow of a first refrigerant flow to divert a portion of the first refrigerant flow to a bypass flow path from a location along the main flow path that is downstream from the first compressor and upstream from the first condenser; dynamically controlling a rate of flow through the bypass flow path; cooling refrigerant flowing through the first condenser by heat exchange with an auxiliary refrigeration cycle that is thermally coupled with the condenser; combining in the mixing chamber flow through the bypass flow path with flow through the main flow path downstream from the first condenser and upstream from the metering device; controlling a ratio of liquid refrigerant and gas refrigerant in an outflow of said mixing chamber; and directing the combined flow from the mixing chamber through the metering device into the first evaporator.

19. The method of claim 18, wherein the refrigerant upstream from the bypass flow path and downstream from the first compressor is fully vaporized.

20. The method of claim 18, wherein said cooling refrigerant flowing through the first condenser comprises condensing said refrigerant into liquid phase.

21. The method of claim 18, further comprising circulating a second refrigerant in a flow path of the auxiliary refrigeration cycle, the auxiliary refrigeration cycle including a second compressor, a second condenser and a second evaporator, wherein the first condenser is thermally coupled to the second evaporator.

22. The method of claim 18, comprising sensing a cooling effect of the main refrigeration cycle and adjusting the rate of refrigerant flow through the bypass flow path based on the cooling effect that is sensed.

23. The method of claim 18, wherein the main flow path is configured to branch out into a plurality of sub-flow paths downstream from the condenser, and wherein refrigerant flowing in each of the plurality sub-flow paths feeds through a corresponding one of a plurality of metering devices into a corresponding one of a plurality of evaporators and wherein the refrigerant flowing in the plurality of evaporators is collected by the accumulator.

24. The method of claim 23, wherein the bypass flow path is configured to branch out into a plurality of sub-bypass flow paths, wherein flow rate of refrigerant through each of the plurality of sub-bypass flow paths is separately controlled, wherein vaporized refrigerant from each of the plurality of sub-bypass flow paths is combined with liquid refrigerant in a corresponding one of the plurality of sub-flow paths of the main flow path, upstream from a corresponding one of the plurality of metering devices.

\* \* \* \* \*